United States Patent
Hu et al.

(10) Patent No.: US 8,901,006 B2
(45) Date of Patent: Dec. 2, 2014

(54) ARC RESIDUE-FREE ETCHING

(75) Inventors: Xiang Hu, Beacon, NY (US); Richard S. Wise, Ridgefield, CT (US); Habib Hichri, Poughkeepsie, NY (US); Catherine Labelle, Wappingers Falls, NY (US)

(73) Assignees: GlobalFoundries Singapore PTE. Ltd., Singapore (SG); International Business Machines Corporation, Armonk, NY (US)

( * ) Notice: Subject to any disclaimer, the term of this patent is extended or adjusted under 35 U.S.C. 154(b) by 349 days.

(21) Appl. No.: 13/081,020

(22) Filed: Apr. 6, 2011

(65) Prior Publication Data
US 2012/0256299 A1 Oct. 11, 2012

(51) Int. Cl.
*H01L 21/3213* (2006.01)
*H01L 21/311* (2006.01)
*H01L 27/11* (2006.01)
*H01L 21/3105* (2006.01)

(52) U.S. Cl.
CPC ..... *H01L 21/32139* (2013.01); *H01L 21/31055* (2013.01); *H01L 21/31111* (2013.01); *H01L 27/11* (2013.01)

USPC ............................. 438/706; 438/673; 438/669

(58) Field of Classification Search
CPC ............ H01L 21/306; H01L 21/30621
USPC ..................................... 438/761, 737
See application file for complete search history.

(56) References Cited

U.S. PATENT DOCUMENTS 7,589,024 B2 * 9/2009 Ueda ........................... 438/696
7,598,174 B1 * 10/2009 Zhuang ........................ 438/689

* cited by examiner

*Primary Examiner* — Julio J Maldonado
*Assistant Examiner* — Mohammad Choudhry
(74) *Attorney, Agent, or Firm* — Ditthavong & Steiner, P.C.

(57) ABSTRACT

Antireflective residues during pattern transfer and consequential short circuiting are eliminated by employing an underlying sacrificial layer to ensure complete removal of the antireflective layer. Embodiments include forming a hard mask layer over a conductive layer, e.g., a silicon substrate, forming the sacrificial layer over the hard mask layer, forming an optical dispersive layer over the sacrificial layer, forming a silicon anti-reflective coating layer over the optical dispersive layer, forming a photoresist layer over the silicon anti-reflective coating layer, where the photoresist layer defines a pattern, etching to transfer the pattern to the hard mask layer, and stripping at least the optical dispersive layer and the sacrificial layer.

10 Claims, 5 Drawing Sheets

US 8,901,006 B2

ARC RESIDUE-FREE ETCHING

TECHNICAL FIELD

The present disclosure relates to the manufacture of patterned structures with improved yield.

BACKGROUND

The manufacture of semiconductor devices such as Static Random Access Memory (SRAM) structures can be challenging due to the need to etch a variety of films in a precise and cost effective manner. A conventional technique employed to manufacture SRAM structures includes the use of a trilayer patterning stack, as is depicted in FIGS. 1A-1C. Such a trilayer patterning stack includes a silicon-containing layer that functions as an anti-reflective layer to modulate the reflectivity of the patterning stack during pattern imaging, and also functions as a hard mask during pattern transfer.

As illustrated in FIG. 1A, a high-κ dielectric layer 12 is formed over the silicon substrate 10. A titanium nitride layer 14 is formed over high-κ dielectric layer 12, an amorphous silicon layer 16 is formed over titanium nitride layer 14, and a hard mask layer 18 is formed over amorphous silicon layer 16. A trilayer patterning stack, comprising sequentially an optical dispersive layer 20, a silicon anti-reflective coating (ARC) layer 22, and a photoresist layer 24 defining a pattern, is then formed over hard mask layer 18.

Etching is then performed to transfer the pattern to the hard mask layer 18, which results in the structure shown in FIG. 1B. Then, a stripping step is performed in an effort to remove the remaining optical dispersive layer 20 and the silicon anti-reflective coating layer 22. However, stripping does not consistently result in the removal of all of the material from the silicon anti-reflective coating layer 22. As shown in FIG. 1C, a residue 26 from the silicon anti-reflective coating layer typically remains after the stripping step when using such a conventional trilayer patterning stack.

It is extremely difficult to completely remove the antireflective layer, e.g., a silicon ARC layer, when transferring the pattern to the hard mask layer. The remaining silicon ARC material within the hard mask openings causes blockages during subsequent of a conductive layer, e.g., a silicon substrate, and consequential conductive paths causing short circuiting resulting in device malfunction and reduced yields. This problem becomes increasingly acute as the thickness of the hard mask layer is reduced to meet the continuously increasing demand for high density devices. This problem becomes even more acute in double patterning double etch processes using a thin hard mask.

A need therefore exists for methodology enabling the fabrication of semiconductor devices comprising accurately formed patterns, particularly conductive patterns, with high reliability and increased yield, and for the resulting devices. A particular need exists for methodology enabling the accurate formatting of fine conductive patterns without forming short circuits, thereby increasing manufacturing yields.

SUMMARY

An aspect of the present disclosure is a method comprising forming a hard mask layer over a silicon substrate, forming a sacrificial layer over the hard mask layer, forming an optical dispersive layer over the sacrificial layer, forming a silicon anti-reflective coating layer over the optical dispersive layer, forming a photoresist layer over the silicon anti-reflective coating layer, the photoresist layer defining a pattern, etching to transfer the pattern to the hard mask layer, and stripping at least the optical dispersive layer and the sacrificial layer.

Another aspect of the present disclosure is a device comprising a conductive pattern formed on a silicon substrate using a patterning stack including a hard mask layer formed over a silicon substrate, a sacrificial layer formed over the hard mask layer, an optical dispersive layer formed over the sacrificial layer, a silicon anti-reflective coating layer formed over the optical dispersive layer, and a photoresist layer formed over the silicon anti-reflective coating layer in a pattern, wherein the conductive pattern is formed by etching to transfer the pattern to the hard mask layer, and stripping at least the optical dispersive layer and the sacrificial layer, and wherein no or substantially no residue from the silicon anti-reflective coating layer remains after the stripping.

Yet another aspect of the present disclosure is a method comprising: forming a patterning stack over a hard mask layer, the patterning stack comprising a sacrificial layer, an optical dispersive layer over the sacrificial layer, and an anti-reflective layer over the optical dispersive layer; and forming a pattern in the hard mask layer by etching through the patterning stack.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves, inter alia, the problem of short circuiting in transferred patterns caused by a residue from an anti-reflective layer, e.g., a silicon anti-reflective coating layer, conventionally employed in a layered patterning stack. Residues of the anti-reflective layer, remaining after stripping, block effective pattern transfer by etching an underlying layer, e.g., a conductive layer such as a silicon substrate. In accordance with embodiments of the present disclosure, all or substantially all of the residue from the silicon anti-reflective coating layer is removed. When using the terminology substantially no residue remains, or substantially all of the residue is removed, the term substantially is referring to situations in which all but a negligible amount of residue is removed to a degree so as not to result in short circuiting of the semiconductor device.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
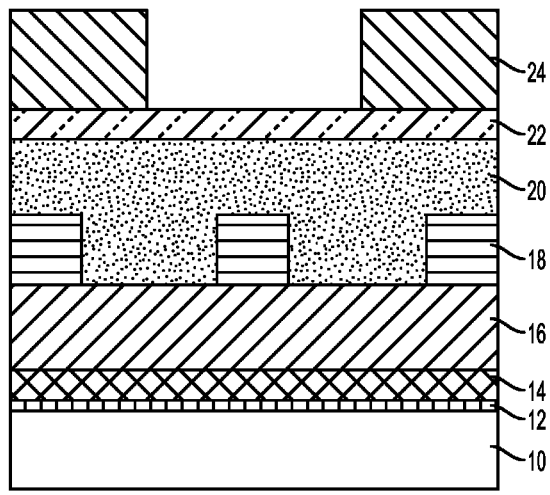
FIGS. 1A-1C schematically illustrate a process flow for manufacturing a semiconductor device using a trilayer patterning stack.
Figure 1B:
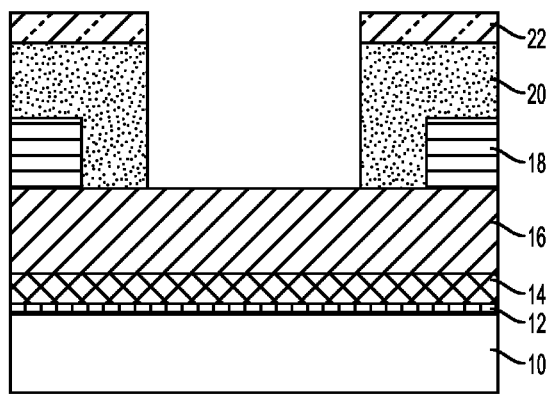
Figure 1C:
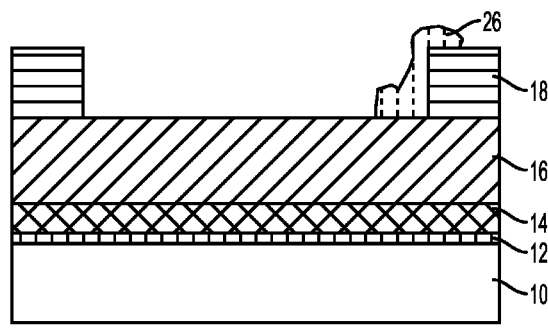
Figure 2A:
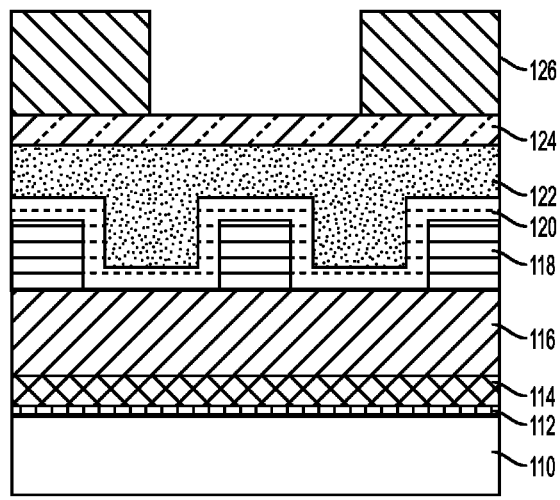
FIGS. 2A-2C schematically illustrate a process flow for manufacturing a semiconductor device using an improved patterning stack according to an exemplary embodiment.
Figure 2B:
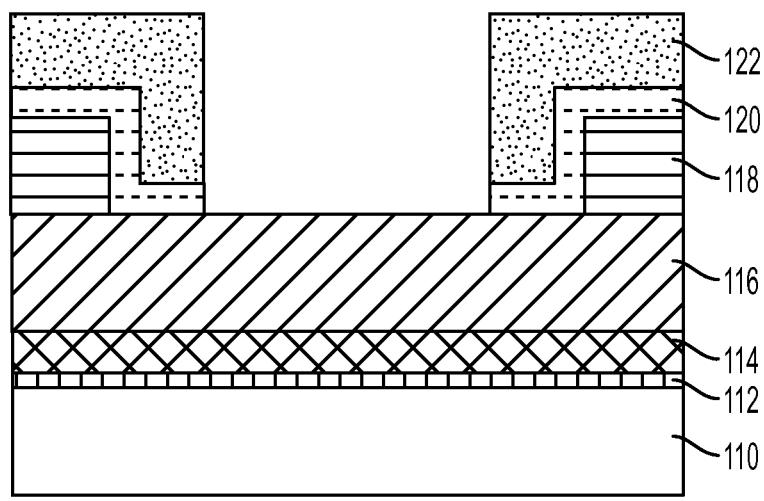
Figure 2C:
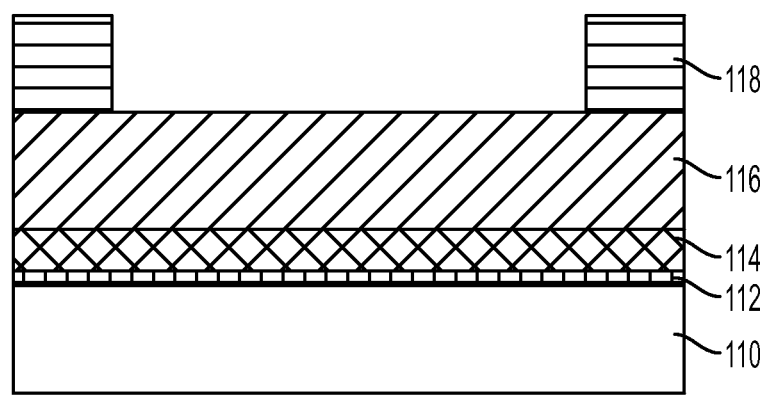
Figure 5:
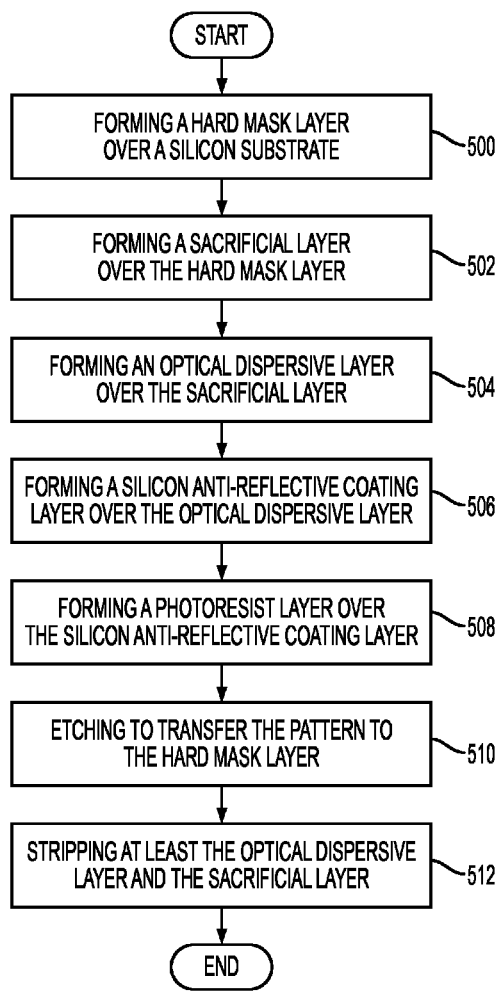
FIG. 5 is a flowchart of a process flow for manufacturing a semiconductor device using an improved patterning stack according to an exemplary embodiment.

FIGS. 2A-2C schematically illustrate sequential phases of a method in accordance with an embodiment of the present disclosure. Additionally, FIG. 5 is a flowchart of a process flow for implementing embodiments of the present disclosure.

As shown in FIG. 2A, a layer 112 comprising a high-κ dielectric material is formed over silicon substrate 110. A titanium nitride layer 114 is formed over the high-κ dielectric layer 112, an amorphous silicon layer 116 is formed over the titanium nitride layer 114, and a hard mask layer 118 is formed over the amorphous silicon layer 116 (see step 500 in FIG. 5). In accordance with embodiments of the present disclosure the hard mask layer may advantageously be formed at reduced thicknesses consistent with the demands for high density devices, such as at 30 Å to 400 Å, e.g., 100 Å to 250 Å. In a non-limiting example, the high-κ dielectric material layer may be formed of hafnium oxide having a thickness of 17 Å, the titanium nitride layer is formed having a thickness of 55 nm, and the amorphous silicon layer is formed having a thickness of 600 Å.

A patterning stack is then formed that includes a sacrificial layer 120 formed over the hard mask layer 118 (step 502 in FIG. 5), an optical dispersive layer 122 formed over the sacrificial layer 120 (step 504), an antireflective layer, such as a silicon anti-reflective coating layer 124, is formed over the optical dispersive layer 122 (step 506), and a photoresist layer 126 is formed over the silicon anti-reflective coating layer 124, wherein the photoresist layer 126 defines a pattern that is ultimately transferred to a targeted underlying layer (step 508). The optical dispersive layer can be any of those conventionally employed during a pattern transfer process, such as ODL 63 or HM8006. The sacrificial layer is desirably transparent to the photolithographic transfer process and exhibits good adhesion to the hard mask layer and the optical dispersive layer, and may comprise a material which can be removed along with the optical dispersive layer during subsequent stripping after completion of the pattern transfer, such as amorphous carbon or other organic materials.

The sacrificial layer may be formed at an appropriate thickness to ensure complete consumption of the anti-reflective layer. Embodiments of the present disclosure include forming the anti-reflective layer at a thickness of 500 Å to 3000 Å, and the sacrificial layer at a thickness of 50 Å to 500 Å, e.g., 100 Å to 250 Å.

Figure 3:
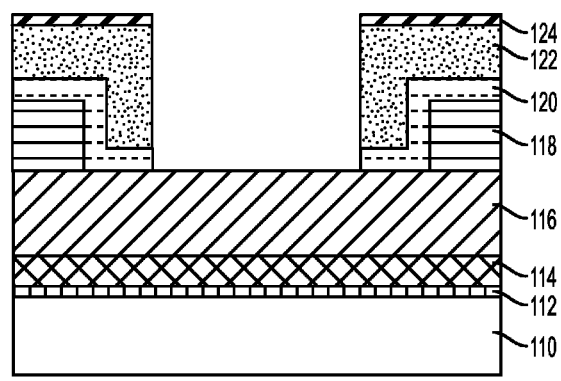
FIG. 3 schematically illustrates a step of a process flow for manufacturing a semiconductor device using an improved patterning stack according to an exemplary embodiment.

Etching (step 510 in FIG. 5), as by dry etching, is then performed to transfer the pattern to the hard mask layer 118. The etching step may result in the structure shown in FIG. 2B in which the silicon anti-reflective coating layer is removed. Alternatively, etching may result in the structure shown in FIG. 3 in which a portion of the silicon anti-reflective coating layer 124 remains and is later removed. Subsequently, a stripping step (step 512) is performed to remove the optical dispersive layer 122 and the sacrificial layer 120. Any remaining portion of the silicon anti-reflective coating layer 124 after etching, as shown in FIG. 3, is removed during the stripping step.

Figure 4:
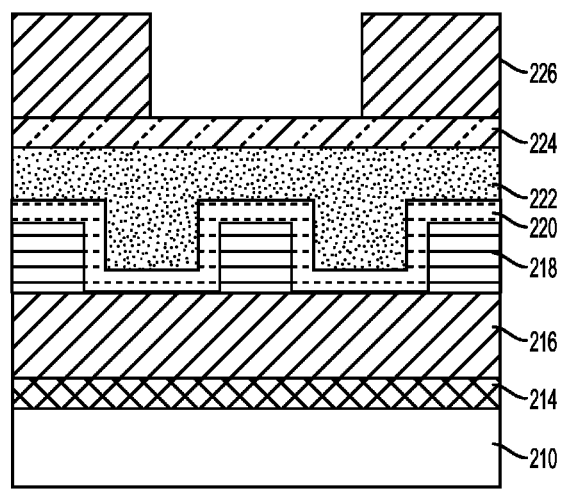
FIG. 4 schematically illustrates a step of a process flow for manufacturing a semiconductor device using an improved patterning stack according to an exemplary embodiment.

FIG. 4 depicts an exemplary embodiment that does not include a layer comprising a high-κ dielectric material formed over the silicon substrate. Thus, the embodiment shown in FIG. 4 includes a titanium nitride layer 214 is formed over a silicon substrate 210, an amorphous silicon layer 216 formed over the titanium nitride layer 214, and a hard mask layer 218 is formed over the amorphous silicon layer 216. A patterning stack is then formed that includes a sacrificial layer 220 formed over the hard mask layer 218, an optical dispersive layer 222 formed over the sacrificial layer 220, an antireflective layer, such as a silicon anti-reflective coating layer 224, is formed over the optical dispersive layer 222, and a photoresist layer 226 is formed over the silicon anti-reflective coating layer 224, wherein the photoresist layer 226 defines a pattern that is ultimately transferred to a targeted underlying layer. Etching and stripping steps are then performed in the manner discussed above with respect to step 510 and step 512.

Thus, an innovative patterning stack is provided that eliminates the residues, such as silicon anti-reflective coating residues, during pattern transfer to a hard mask layer. In accordance with embodiments of the present disclosure, a sacrificial layer is provided to be inserted between the hard mask layer and the organic layer. The addition of the sacrificial layer results in the complete consumption of the silicon anti-reflective coating material during pattern transfer to the thin hard mask layer. The sacrificial layer may be removed after performing the hard mask open (HMO) process. Consequently, remaining silicon anti-reflective coating residue related to defects can be eliminated.

Embodiments of the present disclosure include an innovative quad-layered patterning stack comprising a photoresist layer defining a pattern, a silicon anti-reflective layer, an optical dispersive layer and a sacrificial layer, to completely eliminate silicon anti-reflective coating residues that lead to short circuiting. Etching the sacrificial layer completely or partially consumes the silicon anti-reflective coating.

The embodiments of the present disclosure can achieve several technical effects, particularly in forming ultrafine conductive patterns with high accuracy, reliability, and manufacturing throughput. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a hard mask layer over a silicon substrate;
   forming a sacrificial layer over the hard mask layer;
   forming an optical dispersive layer over the sacrificial layer;
   forming a silicon anti-reflective coating layer over the optical dispersive layer;
   forming a photoresist layer over the silicon anti-reflective coating layer, the photoresist layer defining a pattern;
   etching to transfer the pattern to the hard mask layer; and
   stripping at least the optical dispersive layer and the sacrificial layer;
   wherein the sacrificial layer comprises an amorphous carbon material and extends over a side portion of the hard mask layer.

2. The method according to claim 1, wherein the etching includes etching through the sacrificial layer to the hard mask layer, which results in completely removing the silicon anti-reflective coating layer during the etching.

3. The method according to claim 1, comprising partially removing the silicon anti-reflective coating layer during the etching, and completely removing any remaining portion of the silicon anti-reflective coating layer during stripping.

4. The method according to claim 1, comprising etching the sacrificial layer with an etchant having low selectivity to the silicon anti-reflective coating layer.

5. The method according to claim 4, comprising etching the sacrificial layer with one or more of hydrogen bromide based chemistry, fluorine based chemistry, and chlorine based chemistry.

6. The method according to claim 4, comprising:
   transferring the pattern from the sacrificial layer to the hard mask layer; and
   removing the sacrificial layer.

7. The method according to claim 6, further comprising etching the silicon substrate to form the pattern therein.

8. The method according to claim 1, comprising forming the sacrificial layer at a thickness of 50 Å to 500 Å.

9. The method according to claim 1, wherein no or substantially no residue from the silicon anti-reflective coating layer remains after the stripping.

10. The method according to claim 1, further comprising:
    forming a high-κ dielectric material layer over the silicon substrate;
    forming a titanium nitride layer over the high-κ dielectric material layer;
    forming an amorphous silicon layer over the titanium nitride layer; and
    forming the hard mask layer on the amorphous silicon layer.

* * * * *